US008653888B2

(12) United States Patent
Watanabe

(10) Patent No.: US 8,653,888 B2
(45) Date of Patent: Feb. 18, 2014

(54) HIGH-FREQUENCY SIGNAL AMPLIFIER

(75) Inventor: Shinsuke Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 43 days.

(21) Appl. No.: 13/488,891

(22) Filed: Jun. 5, 2012

(65) Prior Publication Data

US 2013/0093510 A1    Apr. 18, 2013

(30) Foreign Application Priority Data

Oct. 14, 2011    (JP) .................................. 2011-226798

(51) Int. Cl.
*H03F 1/36*    (2006.01)
(52) U.S. Cl.
USPC ............................. 330/107; 330/294; 330/85
(58) Field of Classification Search
USPC ........................................... 330/107, 85, 294
See application file for complete search history.

(56) References Cited

U.S. PATENT DOCUMENTS

| 3,971,021 | A * | 7/1976 | Cann | 342/15 |
| 7,577,404 | B2 * | 8/2009 | Hayashi | 455/78 |
| 8,290,451 | B2 * | 10/2012 | Komatsu et al. | 455/114.2 |
| 8,290,453 | B2 * | 10/2012 | Yoshihara | 455/127.1 |
| 2004/0246068 | A1 * | 12/2004 | Stenberg | 333/117 |
| 2007/0069820 | A1 * | 3/2007 | Hayata et al. | 330/298 |
| 2009/0289717 | A1 * | 11/2009 | Tanaka et al. | 330/277 |

OTHER PUBLICATIONS

M. Jongh, et al., "Mobile Phone Performance Improvements using an Adaptively Controlled Antenna Tuner", *IEEE MTT-S Int. Microwave Symposium Digest*, (2011).
R. Whatley, et al., "CMOS Based Tunable Matching Networks for Cellular Handset Applications", *IEEE MTT-S Int. Microwave Symposium Digest*, (2011).
A. Morris, et al., "High Performance Tuners for Handsets", *IEEE MTT-S Int. Microwave Symposium Digest*, (2011).

* cited by examiner

*Primary Examiner* — Patricia Nguyen
(74) *Attorney, Agent, or Firm* — Leydig, Voit & Mayer, Ltd.

(57) ABSTRACT

A high-frequency signal amplifier includes an amplifier having an input terminal and an output terminal, and amplifying a high-frequency signal; a signal line connected between the output terminal of the amplifier and an antenna; coupled lines arranged in parallel and coupled to the signal line and having different line lengths or differently terminated ends; and phase shifters shifting phase of high-frequency signals applied via the signal line and the coupled lines, supplying the high-frequency signals to the input terminal of the amplifier, and having different amounts of phase change.

6 Claims, 5 Drawing Sheets

HIGH-FREQUENCY SIGNAL AMPLIFIER

BACKGROUND OF THE INVENTION

1. Field of the Invention

The present invention relates to a high-frequency signal amplifier that operates mainly in microwave regions and milli-wave regions.

2. Background Art

With the popularization of the mobile wireless equipment such as mobile phones, the technical advantages of high-frequency signal amplifiers and antennas have been desired. Furthermore, impedance matching between the load of the high-frequency signal amplifier and the load of the antenna is required so that the electric power of the desired high-frequency signal is supplied to the antenna from the high-frequency signal amplifier.

However, depending on the situation of the mobile wireless equipment, the load of the antenna varies. For example, depending on a situation such as where the mobile phone is covered with a hand, placed on an insulator, placed on a conductor, or hung in the air, the load of the antenna varies. Therefore, there was a problem that intended impedance matching could not be realized, and sufficient electric power for high-frequency signals could not be supplied to the antenna.

Therefore, it has been proposed that a detector for detecting the load of the antenna, a variable capacitance, and an integrated circuit for controlling to apply voltage to the variable capacitance depending on the load of the antenna are provided for the output terminal of the high-frequency signal amplifier (for example, see Non-Patent Literatures 1 to 3). Thereby, by varying impedance depending on change in the load of the antenna, the electric power of the high-frequency signal to be supplied to the antenna can be held constant.

Non-Patent Literatures 1: "Mobile Phone Performance Improvements using an Adaptively Controlled Antenna Tuner," 2011 IEEE MTT-S Int. Microwave Symposium Digest, June 2011

Non-Patent Literatures 2: "CMOS Based Tunable Matching Networks for Cellular Handset Applications," 2011 IEEE MTT-S Int. Microwave Symposium Digest, June 2011

Non-Patent Literatures 3: "High Performance Tuners for Handsets," 2011 IEEE MTT-S Int. Microwave Symposium Digest, June 2011

SUMMARY OF THE INVENTION

However, if an integrated circuit for controlling is further provided in addition to the high-frequency signal amplifier, which is an integrated circuit, the constitution of the mobile wireless equipment becomes complicated. The judgment of the voltage to be applied to the variable capacitance also becomes difficult.

In view of the above-described problems, an object of the present invention is to provide a high-frequency signal amplifier which can keep the electric power supplied to the antenna constant by a simple circuit constitution.

According to the present invention, a high-frequency signal amplifier includes: an amplifier having an input terminal and an output terminal, and amplifying a high-frequency signal; a signal line connected between the output terminal of the amplifier and an antenna; a plurality of coupled lines arranged in parallel to the signal line and having different line lengths or different ends respectively; and a plurality of phase shifters shifting phase of high-frequency signals applied via the signal line and the plurality of coupled lines which are coupled respectively, supplying the high-frequency signals to the input terminal of the amplifier, and having different amounts of phase change.

The present invention makes it possible to keep the electric power supplied to the antenna constant by a simple circuit constitution.

Other and further objects, features and advantages of the invention will appear more fully from the following description.

DETAILED DESCRIPTION OF THE PREFERRED EMBODIMENTS

A high-frequency signal amplifier according to the embodiments of the present invention will be described with reference to the drawings. The same components will be denoted by the same symbols, and the repeated description thereof may be omitted.

First Embodiment

Figure 1:
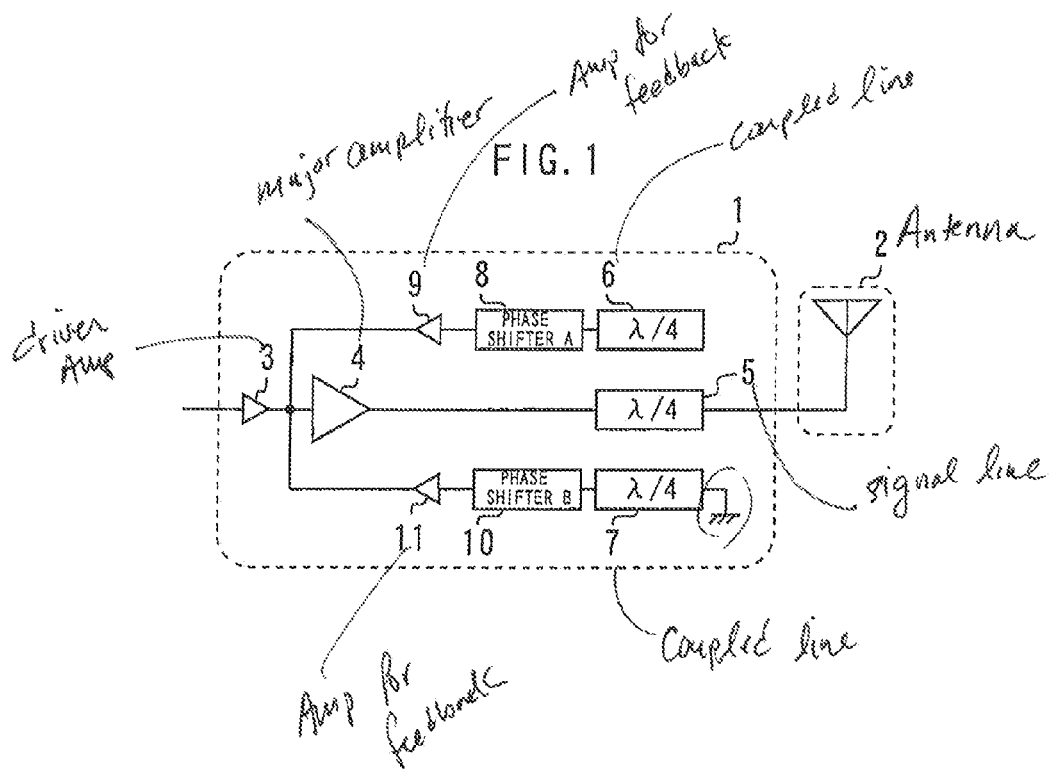
FIG. 1 is a diagram showing a high-frequency signal amplifier according to the first embodiment of the present invention.

FIG. 1 is a diagram showing a high-frequency signal amplifier according to the first embodiment of the present invention. A high-frequency signal amplifier 1 supplies high-frequency signals to an antenna 2. In the high-frequency signal amplifier 1, a driver amplifier 3 amplifies inputted high-frequency signals, and a major amplifier 4 further amplifies them.

Between the output terminal of the major amplifier 4 and the antenna 2, a signal line 5 is connected. In parallel to the signal line 5, coupled lines 6 and 7 are arranged. The line length of the coupled line 6 is a quarter of the wavelength of the high-frequency signals, and the end is open. The line length of the coupled line 7 is a quarter of the wavelength of the high-frequency signals, and the end is short-circuited. The coupled lines 6 and 7 are as close to the signal line 5 as 100 μm or shorter. The ends of the coupled lines 6 and 7 are in the side of the antenna 2.

Depending on the ends or the lengths of the coupled lines 6 and 7, the load of the antenna 2 in the case where the coupling degree of the coupled lines 6 and 7 and the signal line 5 becomes the highest is determined. When the load of the antenna 2 is short-circuited (the reflection phase is 0°), the coupled line 6 whose end is open (the reflection phase is 180°) is strongly coupled to the signal line 5. In this case, a phase shifter 8 shifts the phase of high-frequency signals applied via the coupled signal line 5 and coupled line 6, and supplies them to the input terminal of the major amplifier 4 via an amplifier for feedback 9.

On the other hand, when the load of the antenna 2 is open (the reflection phase is 180°), the coupled line 7 whose end is short-circuited (the reflection phase is 0°) is strongly coupled to the signal line 5. In this case, a phase shifter 10 shifts the phase of high-frequency signals applied via the coupled signal line 5 and coupled line 7, and supplies them to the input terminal of the major amplifier 4 via an amplifier for feedback 11.

The phase shifters 8 and 10 have different amounts of phase change. In more detail, the phase shifter 8 and the amplifier for feedback 9 are designed so that feedback close to positive feedback is realized when the load of the antenna 2 is short-circuited. On the other hand, the phase shifter 10 and the amplifier for feedback 11 are designed so that feedback close to positive feedback is realized when the load of the antenna 2 is open.

Figure 2:
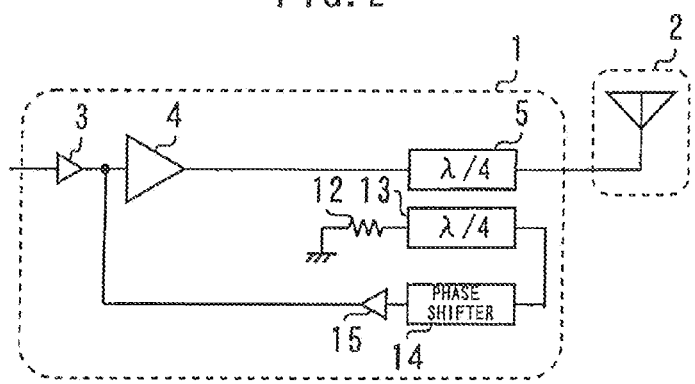
FIG. 2 is a diagram showing a high-frequency signal amplifier according to the comparative example.

Next, the effect of the present embodiment will be described in comparison to a comparative example. FIG. 2 is a diagram showing a high-frequency signal amplifier according to the comparative example. In the comparative example, a single coupled line 13 whose end is connected to a dummy resistor 12 is used.

A case where high-frequency signals are strongly reflected by the antenna 2, and sufficient electric power of the high-frequency signals cannot be supplied to the antenna 2 is considered. In this case, by feedback of reflection signals to the major amplifier 4 via the coupled line 13 to amplify the signals again, the output power of the high-frequency signal amplifier 1 can be improved. In this case, a phase shifter 14 and an amplifier for feedback 15 whose passing phase is adjusted so that the feedback is close to positive feedback are required.

Depending on whether the load of the antenna 2 is open or short-circuited, the reflection phase is different by 180°. Here, it is assumed that the phase shifter 14 and the amplifier for feedback 15 are designed so that feedback close to positive feedback is realized and the output power is improved when the load of the antenna 2 is short-circuited. When the conditions around the mobile phone using such an amplifier is changed, and the load of the antenna 2 is changed to open, the phase of the reflected signals returned to the major amplifier 4 changes by 180°, the feedback close to negative feedback is realized, and output power is oppositely lowered. Thus, in the comparative example, there is a problem that whether gain and output power are enhanced or lowered by feedback depends on the reflection phase of the antenna 2.

Whereas, in the first embodiment, when the load of the antenna 2 is short-circuited, the coupled line 6 is coupled to the signal line 5, signals pass through the phase shifter 8 and the amplifier for feedback 9, and feedback close to positive feedback is realized. On the other hand, when the load of the antenna 2 is open, the coupled line 7 is coupled to the signal line 5, signals pass through the phase shifter 10 and the amplifier for feedback 11, and feedback close to positive feedback is realized.

Figure 3:
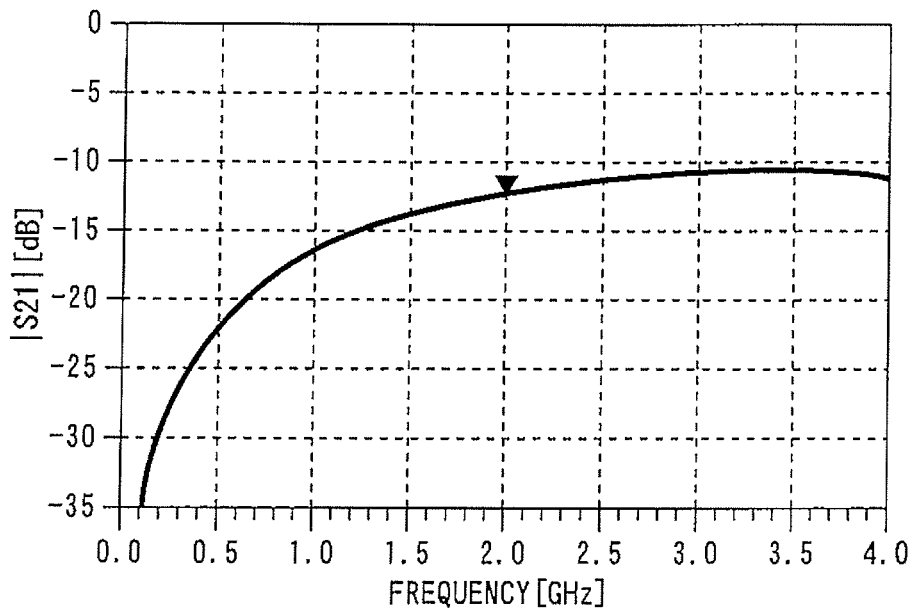
FIG. 3 is graphs showing the result of calculating the passage characteristics of the triple coupled line in FIG. 1 when the load of the antenna is 50 Ω.
Figure 3:
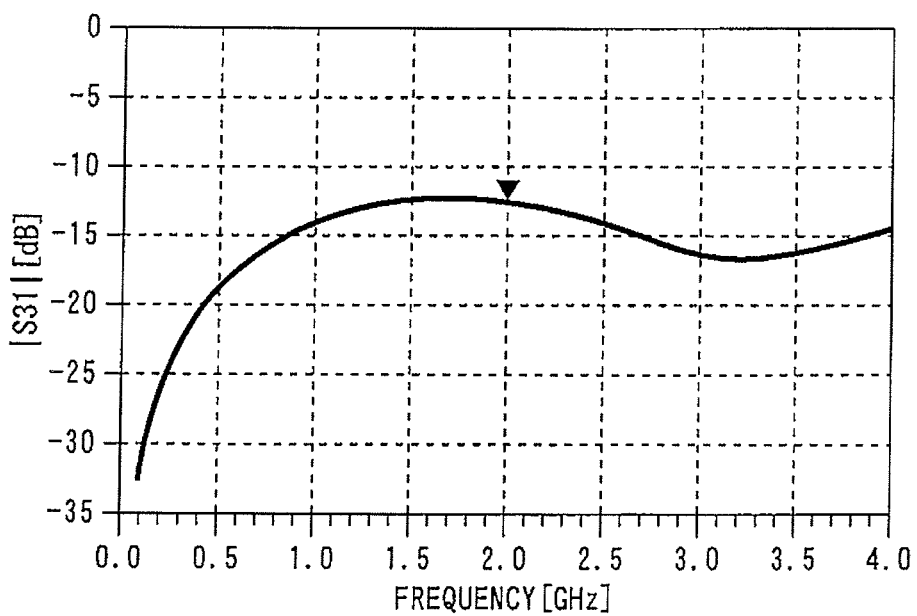
Figure 4:
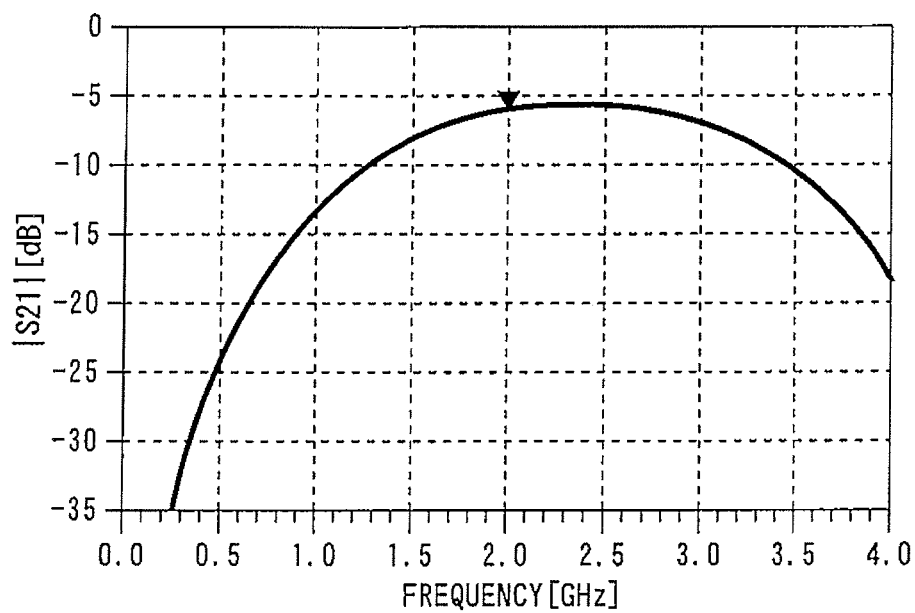
FIG. 4 is graphs showing the result of calculating the passage characteristics of the triple coupled line in FIG. 1 when the load of the antenna is short-circuited.
Figure 4:
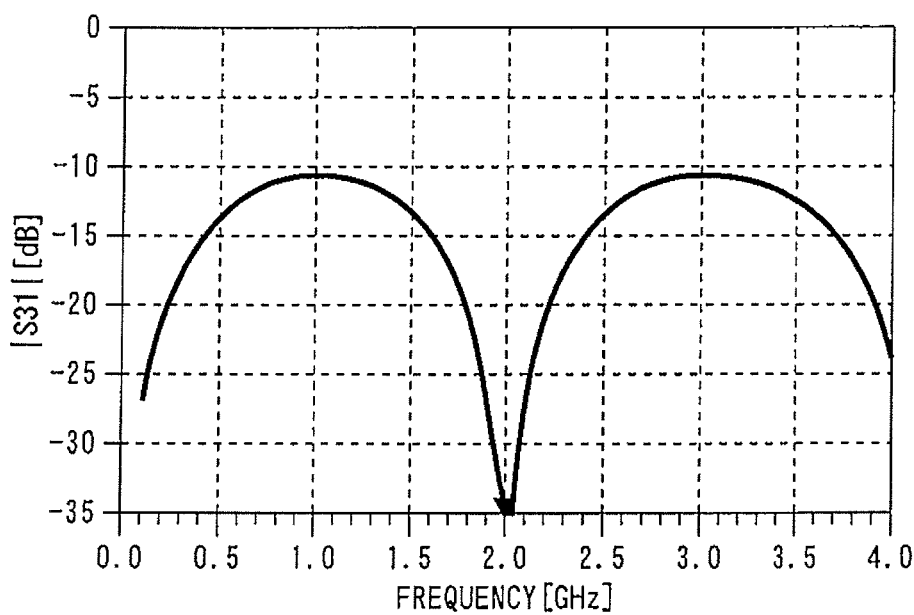
Figure 5:
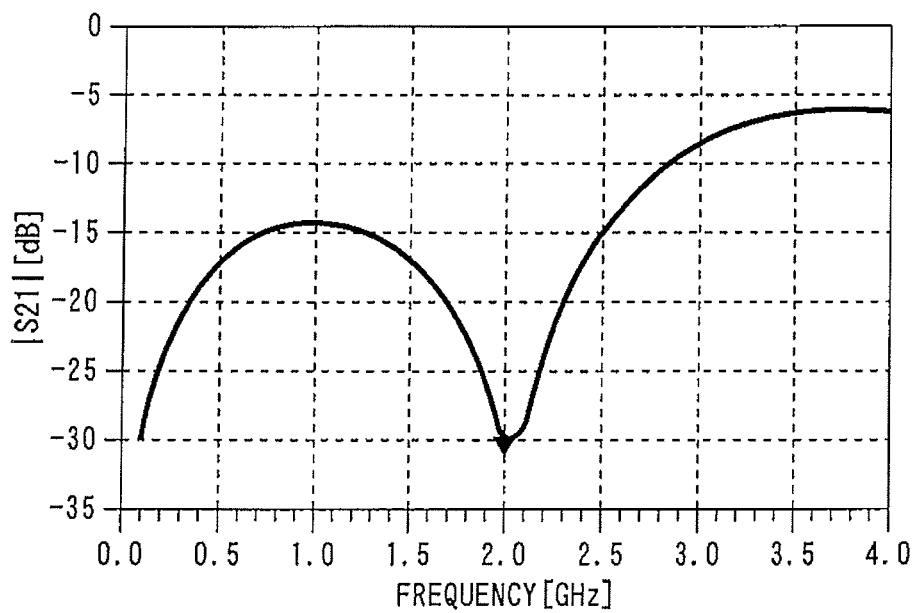
FIG. 5 is graphs showing the result of calculating the passage characteristics of the triple coupled line in FIG. 1 when the load of the antenna is open.
Figure 5:
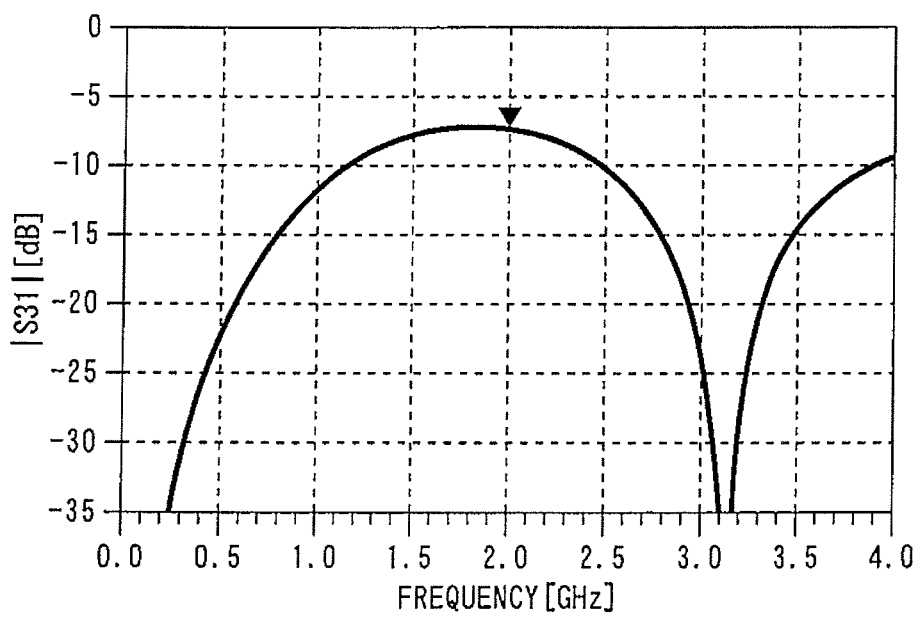

FIG. 3 is graphs showing the result of calculating the passage characteristics of the triple coupled line in FIG. 1 when the load of the antenna is 50 Ω. FIG. 4 is graphs showing the result of calculating the passage characteristics of the triple coupled line in FIG. 1 when the load of the antenna is short-circuited. FIG. 5 is graphs showing the result of calculating the passage characteristics of the triple coupled line in FIG. 1 when the load of the antenna is open. Here, on the assumption of the 2 GHz frequency band, a triple line composed of the signal line 5 and the coupled lines 6 and 7 was designed. |S21| is the penetration of high-frequency signals transmitted from the major amplifier 4 to the phase shifter 8, and |S31| is the penetration of high-frequency signals transmitted from the major amplifier 4 to the phase shifter 10.

In the case of FIG. 3, either penetration to the high-frequency signals having the frequency of 2 GHz is about −12 dB. In the case of FIG. 4, the penetration |S31| to the phase shifter 10 becomes 0, while the penetration |S21| to the phase shifter 8 increases compared to the case where the load of the antenna 2 is 50 Ω. In the case of FIG. 5, the penetration |S21| to the phase shifter 8 becomes 0, while the penetration |S31| to the phase shifter 10 increases compared to the case where the load of the antenna 2 is 50 Ω.

As described above, in the first embodiment, the feedback path is automatically switched depending on the load variation of the antenna 2. For this reason, the operation of the high-frequency signals amplifier 1 is also automatically varied depending on the load variation of the antenna 2. Therefore, the electric power to be supplied to the antenna 2 can be kept constant by a simple circuit constitution.

Figure 6:
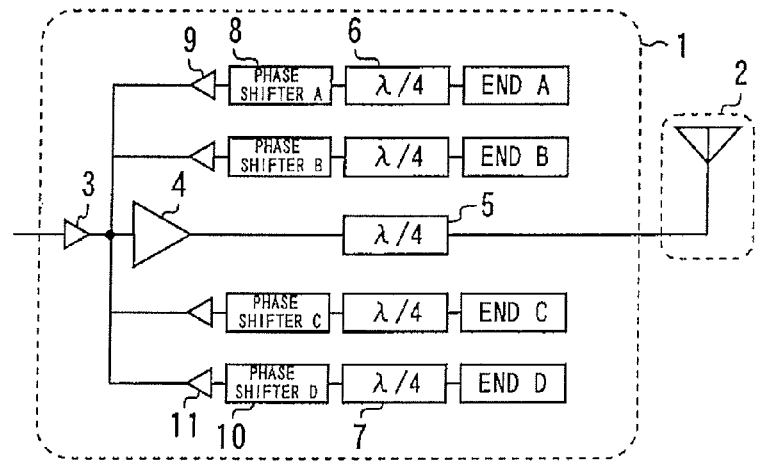
FIG. 6 is a diagram showing a first modification of the high-frequency signal amplifier according to the first embodiment of the present invention.

FIG. 6 is a diagram showing a first modification of the high-frequency signal amplifier according to the first embodiment of the present invention. In the first modification, a quintuple coupled line is used. Even when such a triple or more coupled line is used, the above described effect can be obtained.

Figure 7:
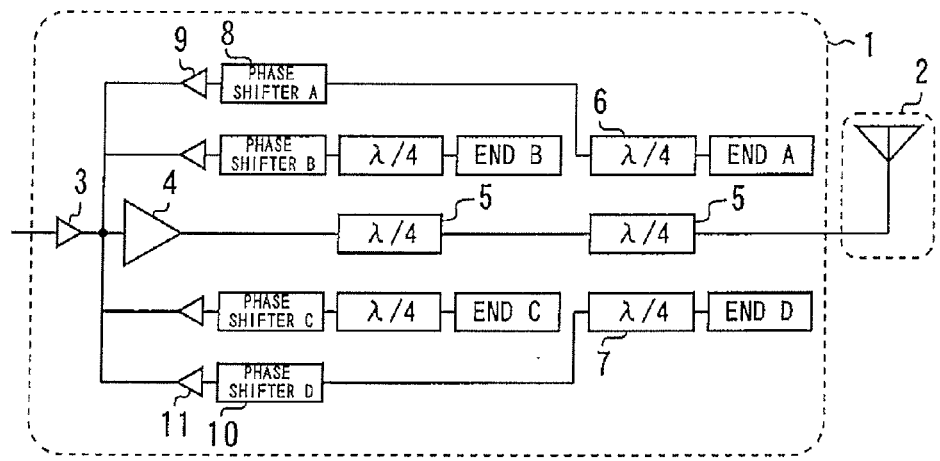
FIG. 7 is a diagram showing a second modification of the high-frequency signal amplifier according to the first embodiment of the present invention.

FIG. 7 is a diagram showing a second modification of the high-frequency signal amplifier according to the first embodiment of the present invention. In the second modification, two stages of triple coupled line are used. Even if two or more stages of coupled lines are connected in series, the above described effect can be obtained.

Second Embodiment

Figure 8:
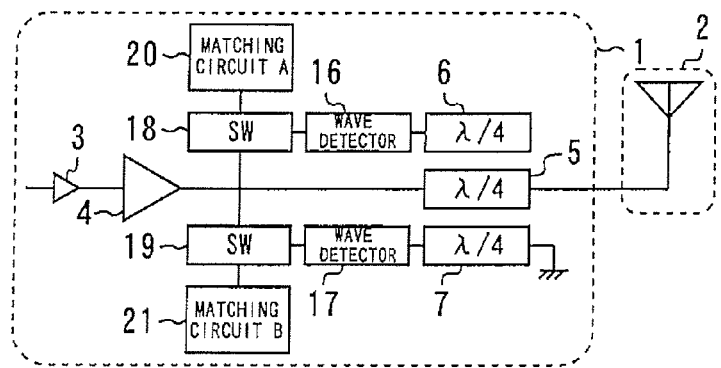
FIG. 8 is a diagram showing a high-frequency signal amplifier according to the second embodiment of the present invention.

FIG. 8 is a diagram showing a high-frequency signal amplifier according to the second embodiment of the present invention. In the second embodiment, wave detectors 16 and 17, switches 18 and 19, and matching circuits 20 and 21 are provided in place of the phase shifters 8 and 10 and the amplifiers for feedback 9 and 11 in the first embodiment.

The wave detectors 16 and 17 output DC signals when high-frequency signals are applied via the coupled signal line 5 and the coupled lines 6 and 7, respectively. Matching circuits 20 and 21 have different impedance transforming amounts. Specifically, the matching circuit 20 is designed so that the impedances of the high-frequency signal amplifier 1 and the antenna 2 are matched when the load of the antenna is short-circuited. On the other hand, the matching circuit 21 is designed so that the impedances of the high-frequency signal amplifier 1 and the antenna 2 are matched when the load of the antenna 2 is open.

The switches 18 and 19 are connected between the output terminal of the major amplifier 4 and the matching circuits 20 and 21, respectively, and are turned ON or OFF depending on DC signals from the wave detectors 16 and 17, respectively. Specifically, when DC signals are applied to the control terminal, the switches 18 and 19 are switched from the OFF state to shut off high-frequency signals to the ON state to pass high-frequency signals. However, when reflection signals from the antenna is weak, the switches 18 and 19 are turned to the OFF state, and the matching circuits 20 and 21 do not affect the operation of the high-frequency signal amplifier.

When the load of the antenna 2 is short-circuited (reflection phase is 0°), the coupled line 6 whose end is open (reflection phase is 180°) is strongly coupled to the coupled signal line 5. In this case, since high-frequency signals are applied via the coupled signal line 5 and coupled line 6, the wave detector 16 outputs DC signals, and the switch 18 is turned ON. Therefore, the matching circuit 20 performs impedance transforming, and the impedance matching of the high-frequency signal amplifier 1 and the antenna 2.

On the other hand, when the load of the antenna 2 is open (reflection phase is 180°), the coupled line 7 whose end is short-circuited (reflection phase is 0°) is strongly coupled to the signal line 5. In this case, since high-frequency signals are applied via the coupled signal line 5 and coupled line 7, the wave detector 17 outputs DC signals, and the switch 19 is turned ON. Therefore, the matching circuit 21 performs impedance transforming, and the impedance matching of the high-frequency signal amplifier 1 and the antenna 2.

Thus, in the second embodiment, the connection of the matching circuits 20 and 21 is automatically switched depending on the load variation of the antenna 2. Thereby, the impedances of the high-frequency signal amplifier 1 and the antenna 2 are automatically matched, and the reflection from the antenna 2 can be inhibited. Therefore, the electric power of the high-frequency signals to be supplied to the antenna 2 can be kept constant by a simple circuit constitution. Furthermore, since the input of the reflection signals from the antenna 2 to the output terminal of the major amplifier 4 can be prevented, the conversion efficiency from the bias power to the high frequency power can be improved.

In addition, depending on the end and the length of the coupled line, the load of the antenna 2 in the case where the coupling degree of the coupled line and the signal line 5 becomes the highest is determined. Therefore, although the coupled lines 6 and 7 whose ends are different are used in the first and second embodiments, a plurality of coupled lines whose lengths are different can also be used. In this case also, the same effect can be obtained.

Moreover, although the coupled lines 6 and 7 strongly coupled to the signal line 5 when the load of the antenna 2 are short-circuited or open are used in the first and second embodiments, coupled lines strongly coupled when the load of the antenna 2 is not short-circuited or open can also be used. When such a coupled line is fabricated, the reflection phase in the end thereof is designed to satisfy the following equation:

(Reflection phase of coupled line end)=180°−(Reflection phase of antenna)

Also, in the second embodiment, even if the coupled lines 6 and 7 are strongly coupled to the signal line 5, the switches 18 and 19 are not switched unless the output power of the high-frequency signal amplifier 1 is sufficiently high. Therefore, to respond to the load variation of the antenna 2 even if the output power is slight, the first embodiment is selected; and to respond to the load variation of the antenna 2 by the output power larger than certain power, the second embodiment is selected. In the second embodiment, the above described effect can also be obtained when triple or more coupled line is used, or two stages or more of coupled lines are connected in series.

In addition, the materials and constitutions of the driver amplifier 3 and the major amplifier 4 are optional. For example, the materials include silicon, germanium, silicon-germanium alloy, silicon nitride, gallium arsenide, gallium nitride, indium phosphide and the like. The constitutions include field-effect transistor, bipolar transistor, vacuum tube and the like.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-226798, filed on Oct. 14, 2011 including specification, claims, drawings, and summary, on which the Convention priority of the present application is based, is incorporated herein by reference in its entirety.

What is claimed is:

1. A high-frequency signal amplifier comprising:
   an amplifier having an input terminal and an output terminal, and amplifying a high-frequency signal;
   a signal line connected between the output terminal of the amplifier and an antenna;
   a plurality of coupled lines, wherein each coupled line is coupled to the signal line, is arranged parallel to the signal line, and has one of (i) a different line length and (ii) a different end termination from the other coupled lines; and
   a plurality of phase shifters shifting phase of high-frequency signals applied via the signal line and the plurality of coupled lines and supplying the high-frequency signals to the input terminal of the amplifier, and having different amounts of phase change.

2. A high-frequency signal amplifier comprising:
   an amplifier having an output terminal, and amplifying a high-frequency signal;
   a signal line connected between the output terminal of the amplifier and an antenna;
   a plurality of coupled lines, wherein each coupled line is coupled to the signal line, is arranged parallel to the signal line, and has one of (i) a different line length and (ii) a different end termination from the other coupled lines;
   a plurality of wave detectors outputting DC signals when high-frequency signals are applied via the signal line and the plurality of coupled lines;
   plurality of matching circuits having different impedance transforming amounts; and
   a plurality of switches, wherein each switch is connected between the output terminal of the amplifier and a respective one of the plurality of matching circuits, and is turned ON or OFF depending on the DC signals from the plurality of wave detectors.

3. The high-frequency signal amplifier according to claim 1, wherein at least one of the plurality of coupled lines has one of an open circuit and a short-circuited end termination.

4. The high-frequency signal amplifier according to claim 1, wherein the plurality of coupled lines are located no more than 100 µm from the signal line.

5. The high-frequency signal amplifier according to claim 2, wherein at least one of the plurality of coupled lines has one of an open circuit and a short-circuited end termination.

6. The high-frequency signal amplifier according to claim 2, wherein the plurality of coupled lines are located no more than 100 µm from the signal line.

* * * * *